United States Patent [19]

Sprogis

[11] Patent Number: 4,801,869
[45] Date of Patent: Jan. 31, 1989

[54] SEMICONDUCTOR DEFECT MONITOR FOR DIAGNOSING PROCESSING-INDUCED DEFECTS

[75] Inventor: Edmund J. Sprogis, Jericho, Vt.

[73] Assignee: International Business Machines Corporation, Armonk, N.Y.

[21] Appl. No.: 42,906

[22] Filed: Apr. 27, 1987

[51] Int. Cl.[4] ............... G01R 31/28; G01R 31/00; G11C 7/00
[52] U.S. Cl. ............... 324/73 R; 324/158 R; 324/158 T; 365/201; 371/21
[58] Field of Search ............... 324/73 R, 158 R, 528, 324/527; 371/21; 365/201

[56] References Cited

U.S. PATENT DOCUMENTS

| | | | |
|---|---|---|---|
| 3,249,926 | 5/1966 | Ashley | 365/201 X |
| 3,983,479 | 9/1976 | Lee et al. | 324/158 R X |
| 3,995,215 | 11/1976 | Chu et al. | 324/73 R X |
| 4,055,754 | 10/1977 | Chesley | 371/21 X |
| 4,061,908 | 12/1977 | de Jonge et al. | 235/302.3 |
| 4,301,535 | 11/1981 | McKenny et al. | 371/21 X |
| 4,320,507 | 3/1982 | Fukushima et al. | 371/21 X |
| 4,393,475 | 7/1983 | Kitagawa et al. | 365/201 X |
| 4,428,068 | 1/1984 | Baba | 365/200 X |
| 4,458,338 | 7/1984 | Giebel et al. | 365/201 X |
| 4,459,694 | 7/1984 | Ueno et al. | 371/21 X |
| 4,464,750 | 8/1984 | Tatematsu | 371/21 X |
| 4,466,081 | 8/1984 | Masuoka | 371/21 X |
| 4,468,759 | 8/1984 | Kung et al. | 365/201 X |
| 4,471,483 | 9/1984 | Chamberlain | 371/21 X |
| 4,685,086 | 8/1987 | Tran | 365/201 X |
| 4,701,919 | 10/1987 | Naitoh et al. | 371/21 X |

FOREIGN PATENT DOCUMENTS 0097334 8/1979 Japan .
0111184 7/1983 Japan .

OTHER PUBLICATIONS

IBM Technical Disclosure Bulletin, vol. 17, No. 9, dated 2/75; A. K. Ghatalia and D. R. Thomas, pp. 2577-2578.
IBM Technical Disclosure Bulletin, vol. 20, No. 8, dated 1/78; N. E. Hallas, R. F. Levine and C. H. Scrivner, Jr., pp. 3099-3100.
IBM Technical Disclosure Bulletin, vol. 17, No. 12, dated 5/75; J. C. Cassani and D. R. Thomas, pp. 3539-3540.
Myers et al. "Testing Magnetic Core Planes"; IBM Technical Disclosure Bulletin; vol. 1 No. 2; Aug. 1958; pp. 21-22.

Primary Examiner—Reinhard J. Eisenzopf
Assistant Examiner—Vinh P. Nguyen
Attorney, Agent, or Firm—Sughrue, Mion, Zinn, Macpeak, and Seas

[57] ABSTRACT

A semiconductor-processing defect monitor construction for diagnosing processing-induced defects. The semiconductor-processing defect monitor utilizes an array layout and includes continuity defect monitoring structures and short-circuit defect monitoring structures. Once a defect has been indicated by a testing operation, the array layout associated with the defect monitor can be used quickly to determine the approximate location of the known defect, thereby facilitating prompt visual observation of the known defect and, thus, prompt determination of the appropriate corrective action to be applied before substantial continued manufacturing has occurred.

16 Claims, 4 Drawing Sheets

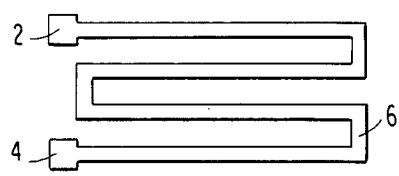
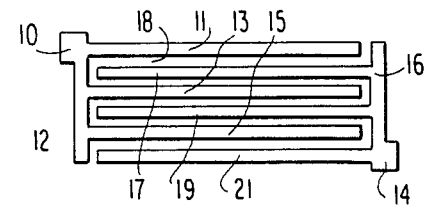
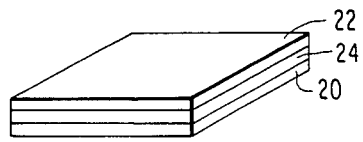
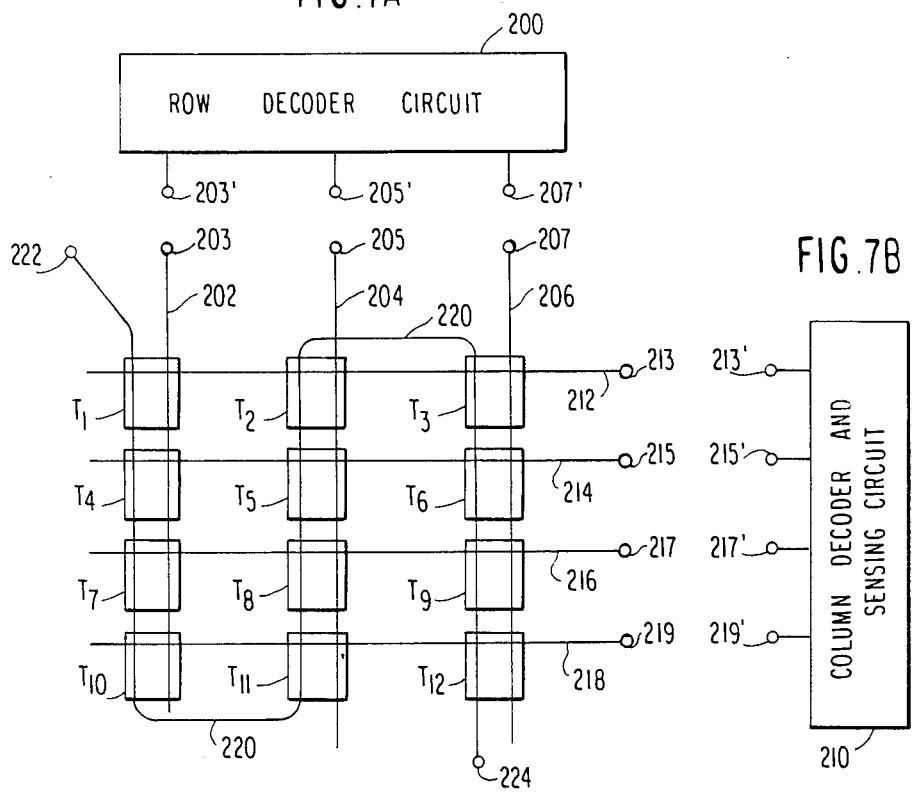

SEMICONDUCTOR DEFECT MONITOR FOR DIAGNOSING PROCESSING-INDUCED DEFECTS

BACKGROUND OF THE INVENTION

1. Technical Field

The present invention relates to a semiconductor-processing defect monitor for diagnosing processing-induced defects.

2. Background Art

An ongoing concern in semiconductor technology, as well as any manufacturing technology, is the maximization of manufacturing yield. One phenomenon contributing to less than optimum manufacturing yields in semiconductor fabrication is that of processing-induced defects. These processing-induced defects cause within semiconductor circuits physical defects which, in turn, cause product failure. By way of example, these processing-induced defects have often been found to cause circuit failure due to open circuits in conductive lines, short-circuits between adjacent conductive lines, and short-circuits between overlying conductive lines at different planar levels. The causes of these processing defects are numerous, e.g., temperature variation, dust contamination in the work area, insufficient disposition of insulation layers, etc.

Analysis of processing-induced defects can be very useful in the prediction and improvement of manufacturing yield. It was found that the use of actual semiconductor products was not practical for the analysis of processing defects, because, in this era of Very Large Scale Integrated Circuits (VLSIC), a semiconductor device typically must undergo an extensive and complex testing procedure before it is found defective. Other than labeling the device as defective, this testing procedure typically yields little additional information as to the number of processing defects which have occurred, and, more important, yields little additional information as to where the defects can be located and visually inspected.

As a result of the above shortcomings, the trend in the semiconductor industry is to fabricate specialized semiconductor-processing defect monitors which have no use other than for the diagnosis of processing defects. Such defect monitor circuits are typically constructed separately from actual VLSIC devices and are discarded once useful defect information has been extracted from them. Typically, one of two approaches may be taken in utilizing these defect monitors.

A first manufacturing approach is periodically to process semiconductor wafers which are dedicated solely to the fabrication of defect monitors. These dedicated wafers are processed in the same processing environment as actual VLSIC devices (although at different times), and are then subjected to diagnosis to determine the defect density and the particular types of induced defects.

A second, more accurate manufacturing approach is the fabrication of defect monitors on the same wafers on which actual VLSIC devices are fabricated. The advantage of this approach is that the device monitors are fabricated in exactly the same processing environment and at exactly the same time as actual VLSIC devices. Thus, the processing defects induced on these defect monitors will be more accurately indicative of the processing defects induced in the actual products. In this approach, the defect monitors are typically fabricated within the kerf or discardable portion of the semiconductor wafer.

The design of a semiconductor-processing defect monitor can be varied in a number of ways to test for different failure types resulting from processing-induced defects.

As a first example, FIG. 1A shows a defect monitor having a simplified continuity-monitoring pattern. A line 6, which is shown connected to test contact pads 2 and 4, is made of a conductive material and is configured in a serpentine layout. After the fabrication this continuity-monitoring pattern by semiconductor-processing, electrical connections can be made to the test contact pads to test for continuity between the pads. If a processing variation has caused an open circuit defect along line 6, then an electrical discontinuity between the test contact pads will be indicated. In the design of the continuity-monitoring pattern of FIG. 1A, it should be noted that statistical calculations are often used to choose a length and width of line 6 such that there is a high probability of only one defect occurring along the line, thereby maintaining a one-to-one correspondence between the occurrence of a defect and the occurrence of a monitor failure so that the defect distribution density across a semiconductor wafer can be accurately determined. Finally, it should be noted that FIG. 1A is a simplified illustration of a continuity-monitoring pattern; i.e., a practical continuity-monitoring pattern would typically encompass a much greater length and complex serpentine structure, and would occupy a large area of a semiconductor layer.

As a second example, a defect monitor can also be designed to include a short-circuit monitoring pattern as shown in FIG. 1B. In FIG. 1B, test contact pads 10 and 14 are shown connected to bus bars 12 and 16, respectively, which in turn, are shown are connected to finger projections 11, 13, 15 and 17, 19, 21, respectively. These structures are all formed of a conductive material and are typically on the same planar level. In the construction of such a short-circuit monitoring pattern, the main objective is to test for processing-induced short-circuits between closely spaced parallel lines. If the processing variation has induced a short-circuit defect between two adjacent finger projections, the defect will be indicated by electrical continuity between the test contact pads 10 and 14. The space 18 represents a "minimum ground rule" spacing between adjacent finger projections 11 and 17. Similar minimum ground rule spacings are provided between the other adjacent finger projections. Statistical calculations can again be used to design an appropriate number of finger projections and to determine the minimum ground rule spacings, so that there is a high probability that only one process defect will occur per short-circuit monitoring pattern, thereby maintaining a one-to-one correspondence between the occurrence of a defect and the occurrence of a monitor failure to permit an accurate determination of the defect distribution density across the semiconductor wafer. Finally, it should also be noted that FIG. 1B is a simplified illustration of a short-circuit monitoring pattern; i.e., a practical short-circuit monitoring pattern would typically encompass a tremendous number of finger projections and would occupy a substantial semiconductor layout area.

As a third example, a semiconductor-processing defect monitor can also be constructed, as shown in FIG. 1C, to monitor for short-circuits between conductive lines on different planar levels. In Figure 1C, there is shown an upper conductive level 22 separated from a lower conductive level 20 by an insulating layer 24. The main object of such a defect monitor construction is to test for processing-induced short-circuits between overlying conductive levels. Typical insulating layer defects which can be induced during processing include localized thinning or absence of insulating material, porosity and/or pin holes in the insulating layer. If the processing variation induces a defect in the insulating layer 24 such that a short-circuit occurs, electrical continuity will be found to exist between the upper and lower conductive levels 22 and 20. Finally, it should again be noted that the defect monitor shown in FIG. 1C is a simplified illustration; i.e., a practical defect monitor would typically be much more complex to provide for testing for short-circuit occurrences between numerous planar levels.

The above semiconductor-procesing defect monitors are disclosed and further described in *IBM Technical Disclosure Bulletin*, Volume 17, No. 9, dated February 1975, and authored by Ghatalia and Thomas.

In addition, there are numerous other prior art references directed towards the construction and use of semiconductor-processing defect monitors.

For example, U.S. Pat. No. 3,983,479—Lee et al, assigned to the current assignee, discloses a defect monitor using a combination of continuity and short-circuit test patterns along with diode-mode FET amplifiers, such that testing can be made for defects without interference between adjacent patterns.

*IBM Technical Disclosure Bulletin*, Volume 20, No. 8, dated January 1978, and authored by Hallis, Levine and Scribner, discloses parallel serpentine test patterns having a first portion which is horizontally oriented, and a second portion which is vertically oriented, such that the defect monitor is sensitive to defects induced in the horizontal as well as the vertical direction.

*IBM Technical Disclosure Bulletin*, Volume 17, No. 12, dated May 1975, and authored by Cassani and Thomas, discloses a defect diagnostic circuit composed of an orthogonal array of metal lines and diffusion lines which can be diagnostically tested for various defects by selectively activating different transistors associated with each of said lines.

Additional references providing background for this technology include: U.S. Pat. No. 4,459,694-Ueno et al; U.S. Pat. No. 4,320,507-Fukushima et al; U.S. Patent No. 4,471,483-Chamberlain; U.S. Pat. No. 4,454,750-Tatematsu; U.S. Pat. No. 4,428,068-Baba; U.S. Pat. No. 4,061,908-de Jonge et al; U.S. Pat. No. 4,393,475-Kitagawa et al; U.S. Pat. No. 4,458,338-Giebel et al; U.S. Pat. No. 4,466,081-Masuoka; U.S. Pat. No. 4,468,759-Kung et al; Japanese Patent No. 97,334; and Japanese Patent No. 111,184.

The state of the semiconductor art is such that, if individual defects can be visually examined, diagnosis of the processing variation which caused the defect can be made to determine the appropriate corrective action. However, it should be stressed that, in order to facilitate this diagnosis, accurate location and visual observation of known defects are of key importance. As a further requirement, the location and visual observation operations should be readily and quickly implementable in order quickly to provide feedback data to prevent continued manufacturing under low yield processing conditions. Meeting these requirements is not an easy task, considering the fact that a typical processing-induced defect is of a submicron size, and can be located anywhere in a semiconductor circuit.

Although the defect monitors previously discussed typically produce good defect density data, these defect monitors usually produce little additional information as to where on the defect monitor circuit a particular defect has occurred. Instead, these testing approaches, simply utilizing continuity and/or conductivity measurements, produce only pass/fail data. Thus, if one of these defect monitors were found to be adversely affected by a processing defect, the entire defect monitor must be visually scanned with magnification instruments to locate and visually observed the defect. As test patterns typically occupy a substantial layout area of a semiconductor layer, it becomes a very tedious, or even impossible, task to use magnification instruments visually to scan the patterns for submicroscopic defects. Furthermore, as such visual scanning requires an exorbitant amount of time to produce diagnostic data, manufacturing yield is still negatively affected because of the substantial continued manufacting under low yield processing conditions.

Consequently, there has long existed a need for a semiconductor-processing defect monitor in which the location and visual observation of defects can be easily and readily implemented in order quickly to provide corrective feedback data.

SUMMARY OF THE INVENTION

Thus, it is an object of the present invention to provide a semiconductor-processing defect monitor in which the approximate location of individual defects can be quickly and easily determined to facilitate visual examination of the defects.

Another object of the invention is to provide a semiconductor-processing defect monitor which includes continuity test structures to test for open-circuit induced defects.

Another object of the present invention is to provide a semiconductor-processing defect monitor which includes short-circuit test structures, to rest for short-circuit induced defects between adjacent conductive lines.

A further object is to provide a semiconductor-processing defect monitor which includes insulation layer short-circuit test structures, to test for short-circuits induced defects between overlapping conductive layers.

These and other objects of the present invention are realized, in one term of the invention, in a semiconductor-processing defect monitor having a matrix array of test cells arranged in columns and rows, and at least one serpentine conductive line connected at various locations along its length to the individual test cells of the matrix array. Each test cell has at least one transistor connected to a row and column line such that the row line, column line and transistor can be used to connect the test cell to the serpentine line. Since each individual test cell is connected at a different location along the serpentine line, selective access of individual test cells can be used to facilitate selective electrical access to different lengths of the conductive lines.

In regard to defect monitioring, the serpentine line can be continuity-tested for open-circuit induced defects. If a defect has been induced, its location can be easily determined using the matrix array of test cells selectively to access different lengths of the conductive lines. In another testing operation, the row and column lines can be defect tested by applying a voltage potential to the serpentine line and then each individual test cell is selectively activated in an attempt to access the voltage potential. By conducting the above two testing operations, pass/fail data can be analyzed using a bit map approach to determine the type and approximate location of a known defect. In a third testing operation, testing for short-circuit induced defects between different planar levels can be conducted by applying continuity tests between the respective individual row, column, and serpentine lines which normally should be isolated from one another. Finally, to facilitate testing for short-circuit induced defects between conductive lines on the same planar level, each test cell is additionally provided with conductive lines "finger" structures which are parallel to the row, column, and the serpentine lines.

Accordingly, the present invention relates to a semiconductor-processing defect monitor comprising:
 a conductive line;
 a plurality of column lines connectable to column decoder circuitry;
 a plurality of row lines connectable to row decoder circuitry; and
 a plurality of test cells, each respective test cell being provided at a different location along the length of said conductive line, each said respective test cell having transistor means connected to said conductive line, one of said row lines, and one of said column lines, such that said row lines, said column lines and said transistor means of said test cells can be used to facilitate selective electrical access to different lengths of said conductive line.

BRIEF DESCRIPTION OF THE DRAWINGS

The foregoing and other structures and teachings of the present invention will become more readily apparent upon a detailed description of the preferred embodiment for carrying out the invention as rendered below. In the description to follow, reference will be made to the accompanying drawings, in which;

FIGS. 1A through 1C are simplified topographical and perspective diagrams of prior art semiconductor-processing defect monitors.

FIG. 2 is a simplified circuit diagram of one embodiment of a semiconductor-processing defect monitor of the present invention.

FIGS. 7A and 7B are simplified block diagrams of row decoder circuitry, and column decoder and sensing circuitry which can additionally be combined with the circuit of FIG. 2.

DETAILED DESCRIPTION OF THE PREFERRED EMBODIMENT

Figure 3:
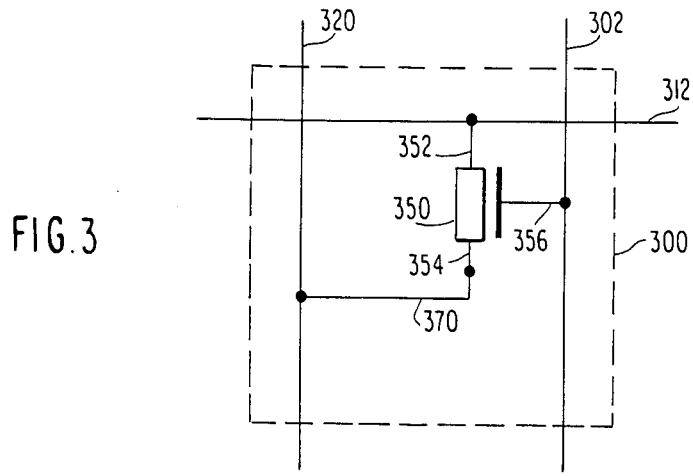
FIG. 3 is a simplified schematic diagram of one embodiment of a test cell of the present invention.

One embodiment of the present invention is shown in FIGS. 2 and 3. It should be understood that, in a preferred manufacturing approach, this semiconductor-processing defect monitor would be a semiconductor circit fabricated in the kerf area of a semiconductor wafer.

In FIG. 2, there is shown a serpentine line 220 having its ends terminated with the test contact pads 222 and 224. The serpentine line 220 is a line of conductive material which is formed at one of the planar levels of a semiconductor circuit; for example, serpentine line 220 can be of a doped polysilicon, of a diffusion level, or of a metal material formed as a wiring structure on top of the semiconductor substrate. The test contact pads 222 and 224 are also formed of a conductive material and, in a practical arrangement, are formed on the top surface of the semiconductor wafer to facilitate mechanical/electrical connection to the serpentine line 220.

At this point, it is useful to note that the serpentine line 220, along with its test contact pads 222 and 224, represents a continuity defect monitor. More specifically, once the serpentine line 220 and the test contact pads 222 and 224 have been fabricated in the semiconductor wafer, mechanical/electrical contact can be made to the contacts 222 and 224 to test for electrical continuity therebetween. If the processing environment were such as to induce an open circuit defect along the serpentine line 220, continuity would not exist between the test contact pads 222 and 224.

It should be noted that, standing alone, the serpentine line 220 does not permit easy determination of the approximate location of known defects. More specifically, continuity testing using the test contact pads 222 and 224 provides only pass/fail test data. Thus, the semiconductor-processing defect monitor of the present invention includes further constructions.

In FIG. 2, there is shown a matrix array of test cells $T_1$ through $T_{12}$ which are arranged in a row and column fashion similar to that used for semiconductor memory devices. As an example, row 1 includes the test cells $T_1$, $T_4$, $T_7$, and $T_{10}$, and column 1 includes the test cells $T_1$, $T_2$, and $T_3$. It should be noted that the test cell array of FIG. 2 has been limited to twelve test cells for the sake of simplicity of illustration. The defect monitor of the present invention is very versatile in that the test cells represent building blocks or segments which can be used to construct any size array. By way of example, a very small defect monitor, such as the twelve cell array in FIG. 2, could be constructed, or a defect monitor array could easily be designed to match the cell capacities of modern memory devices.

One aspect, which is dependent on the size of an array, should be noted. Once a monitor has been fabricated, connection must be made to the defect monitor in order to conduct testing operations and to extract test data from the array. Two approaches are available.

With smaller arrays (such as the twelve cell array illustrated in FIG. 2), a first approach can be used whereby each of the row and column lines is provided with a test contact pad. Interfacing with the defect monitor is obtained using mechanical/electrical contact to the appropriate test contact pads 203, 205, 207, 213, 215, 217, 219, 222 and/or 224. This mechanical/electrical contact is typically made by using a probe card having tiny pin structures which are appropriately aligned to make contact to the respective test contact pads. The probe card is thus used as a vehicle for providing an interface between the defect monitor and remote support circuitry, for example, row and column decoder circuitry which are used to selectively access individual test cells. The external testing circuitry can also include microprocessor means and memory means for storing a program, such that a series of continuity and short-circuit tests are automatically performed on the semiconductor-processing monitor. Finally, in using this approach, the resultant test data can be fed directly from the probe card to a computer to provide quick analysis and determination of the approximate location of known defects, thereby providing for prompt visual observation and a quick determination of the appropriate corrective action.

As array size increases, the above approach becomes impractical for a number of reasons. First, with larger arrays, the pitch (or spacing) between lines becomes extremely small with respect to the much larger size required for a practical test contact pad. A point is reached where there is insufficient silicon area to include a test contact pad for each of the row or column lines. As a second constraint, a probe card has a practical limitation as to the number of probe pins which can be included.

A second, preferred approach is the fabrication of desired support circuitry along with the fabrication of the defect monitor. This approach is applicable to both large and small defect monitor arrays. One advantage of using this approach is that only a small number of additional test contact pads must be included to provide interfacing with the support circuitry.

By way of example of one preferred embodiment, FIG. 2 is illustrated along with block diagrams representing several support circuitries which are highly desirable. One portion of this preferred embodiment is represented by FIG. 7A which comprises a row decoder circuit 200 having terminals 203', 205', and 207'. In an actual semiconductor fabrication, these terminals 203', 205', and 207', would be connected to the row lines 202, 204 and 206, respectively. A second portion of this preferred embodiment is represented in FIG. 7B which comprise a column decoder and sensing circuit 210. This column decoder and sensing circuit includes terminals 213', 215', 217' and 219', which in a semiconductor fabrication would be connected to the column lines 212, 214, 216 and 218, respectively. The internal circuitry of the row decoder 200 and the column decoder circuit 210 is not shown as these devices, per se, are not the subject matter of the present invention, and numerous possible circuit configurations are well known in the art. Although not shown, an appropriate number of test contact pads would be further included to provide interfacing with these support circuits.

With smaller arrays, test contact pads for each of the row and column lines can further be included to serves as backup connections to the defect monitor, should any of the fabricated support circuits become defective due to processing-induced defects. To minimize the possibility of any such failure, the support circuits should be designed to have a high tolerance to processing-induced defects.

Each of the test cells $T_1$ through $T_{12}$ is provided with a unique combination of a row line and column line in a manner similar found in memory array constructions. Thus, as should now be apparent, the purpose of the row lines 202, 204 and 206, the column lines 212, 214, 216, and 218, and the test contact pads 203, 205, 207, 213, 215, 217 and 219 is to provide a means for accessing each of the individual test cells $T_1$ through $T_{12}$.

A very important aspect of the defect monitor of FIG. 2 is that the serpentine line 220 is fabricated so that it crosses or passes in close proximity to each of the individual test cells $T_1$ through $T_{12}$. As will become more clearly apparent with respect to the illustration of FIG. 3, the serpentine line 220 is connected to each of the test cells $T_1$ through $T_{12}$. As can be noted from FIG. 2, the connection of each of the individual test cells $T_1$ through $T_{12}$ occurs at a different location along the serpentine line 220. Thus, in effect, the serpentine line 220 is electrically divided into differnt lengths by the connections to the test cells $T_1$ through $T_{12}$.

Before the operation of the defect monitor of FIG. 2 is described, a more detailed description of the test cell construction is in order. In FIG. 3, there is shown a simplified schematic diagram of one embodinent of a test cell 300 of the present invention. For simplicity of illustration, only one test cell has been shown in detail. It should be noted that the test cell 300 could easily correspond to any of the individual test cells $T_1$ through $T_{12}$. For example, if the test cell 300 were to correspond to the test cell $T_1$ in FIG. 2, then column line 312, row line 302 and serpentine 320 would correspond to the column line 212, the row line 202, and the serpentine line 220, respectively.

The test cell 300 is provided with a unique combination of a column line 312 and a row line 302 which represent semiconductor constructions of conductive material. In a preferred embodiment, the column line 312 would be made of a metallic material formed on top of the semiconductor wafer, and the row line 302 would be of a polysilicon material. It should be noted that only a portion of the column line 312 and of the row line 302 is shown; i.e., the actual row and column lines would be much longer to service additional test cells in the column and row, respectively.

Also shown in FIG. 3 is a serpentine line 320 which represents a conductive material structure in the semiconductor circuit. In a preferred embodiment, this line would be a diffusion conductive material formed at a diffusion planar level. Again, only a portion of the serpentine line 320 is shown; i.e., the actual serpentine line would be much longer to cross or pass in close proximity to each of the individual test cells in the defect monitor array.

The test cell 300 is shown further to comprise a transistor 350 which can be of any semiconductor construction, and in a preferred embodiment is an FET. The FET comprises a first current-carrying electrode 352, a second current-carrying electrode 354 and a control electrode 356. The first current-carrying electrode 352 is connected to the column line 312, the control electrode 356 is connected to the row line 302, and the second current carrying electrode 354 is connected to the line 370 which, in turn, is connected to the serpentine line 320.

It can be seen from the schematic diagram of Figure 3 that, if the row line 302 is selected and appropriately activated to cause the transistor 350 to conduct, the column line 312 is electrically connected to the serpentine line 320.

The internal circuitry of the test cell having been described, the defect monitoring operations of the present invention will not be described.

As mentioned previously, the test contact pads 222 and 224 can be used to perform a continuity test of the serpentine line 220. If there is induced an open circuit defect which interrupts this continuity, such a continuity test provides no data as to the location of the known defect.

To cure this deficiency, the present invention uses a matrix mapping approach to provide the approximate location of the processing-induced defect. As previously described, row lines 202, 204, 206, column lines 212, 214, 216, 218 and test contact pads 203, 205, 207, 213, 215, 217, 219 can be used selectively to access each of the individual test cells $T_1$ through $T_{12}$. Since each of the individual test cells is connected to the serpentine line 220 at a different location, a unique combination of a row line 202, 204, or 206, and a column line 212, 214, 216 or 218 can be used to turn on the internal transistor of an individual test cell such that selective electrical connection can be made to various lengths of the serpentine line 220.

As an illustrative example of locating a processing defect along the serpentine line 220, it will be assumed that there is an open-circuit defect induced such as to interrupt the continuity of the serpentine line 220 between the test cells $T_2$ and $T_5$. This defect is illustrated as an "X" in FIG. 4. Furthermore, in this example, it is assumed that the row lines 202, 204, 206, column lines 212, 214, 216, 218, and the test cells $T_1$–$T_{12}$ are themselves operating without processing-induced defects.

After the semiconductor-processing defect monitor of FIG. 2 has been fabricated, mechanical/electrical contact is made to the test contact pads 222 and 224 to allow continuity testing of the serpentine line 220. Since the open-circuit defect has interrupted the continuity, the test will produce a "fail" result. At this point there is no information as to approximate location of the known defect.

In order to gain the additional location data, the test contact pad 222 or 224 is used as one electrical contact point in applying a series of continuity tests. In the illustrative example of this description, the series of continuity tests will be described using the test contact pad 222; however, a similar description could be made for the use of test contact pad 224.

In a first continuity test, the unique combination of the row line 202 and column line 212 is used to selectively activate the internal transistor of the test cell $T_1$ so that the column test 212 is effectively connected to the serpentine line 220, whereby a continuity test can be conducted between the test contact pads 222 and 213. If the length of the serpentine line 220 between the test contact pad 222 and the test cell $T_1$ is good, continuity will be detected. However, if an open-circuit processing defect was induced along this length, continuity will not be detected. In the assumed example, continuity is detected.

Once the length of the serpentine line 220 between the test contact pad 222 and the test cell $T_1$ has been tested, the test cell $T_4$ is used to test the next length of the serpentine line 220. More specifically, the row line 202 is used to activate the internal transistor of the test cell $T_4$, and then continuity is tested between the test contact pads 222 and 215. In the example given, continuity is again facilitated.

In order thoroughly to test the serpentine line, ever increasing subsequent lengths of the serpentine line 220 are tested utilizing the test cells $T_7$, $T_{10}$, $T_{11}$, $T_8$, $T_5$, $T_2$, $T_3$, $T_6$, $T_9$ and $T_{12}$, respectively. Note that this sequence follows the length of the serpentine line 220.

Figure 4:
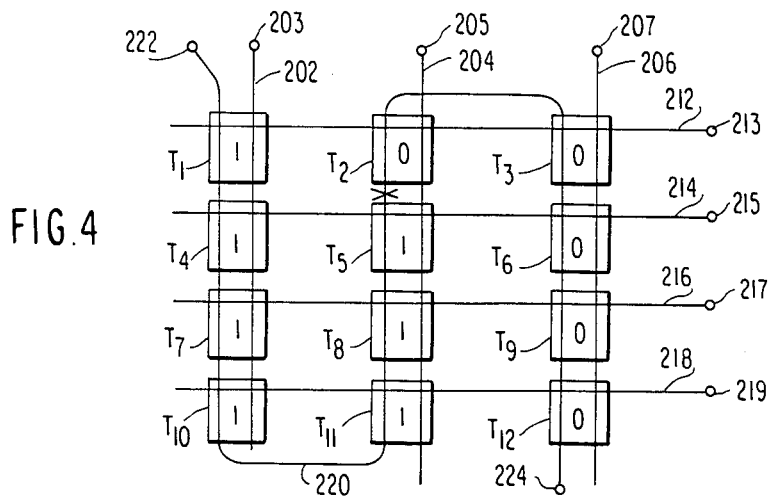
FIG. 4 illustrates the manner in which bit map analysis is used approximately to locate an open-circuit defect induced in a long conductive line of the defect monitor of FIG. 2.

At this point, it should be noted that the test cells are laid out in an orderly row/column fasion. This aspect of the present invention is important in the respect that it represents a very convenient mechanism for analyzing test data and locating a processing defect. In this regard, a representation of the semiconductor layout is used as a map with which to plot the test data. FIG. 4 is a simplified version of one such representation. Once each of the individual test cells has been used to continuity-test different length portions of the serpentine line 220, the respective testing results can be entered in each respective test cell representation in the map.

By plotting the test data of the above testing operations following the length of the serpentine line, the location of the open-circuit defect can easily be determined. In FIG. 4, note that a logical one has been posted in each of the test cells along the sequence $T_1$, $T_4$, $T_7$, $T_{10}$, $T_{11}$, $T_8$, $T_5$. Thus, continuity has been detected from the test control pad 222 through the point of the serpentine line 220 at which the test cell $T_5$ is connected. In contrast, note that continuity is not detected along the remainder of the serpentine line as indicated by the logical zeros in the test cells of the sequence $T_2$, $T_3$, $T_6$, $T_9$ and $T_{12}$. From the above it can be determined that an open-circuit defect has been induced somewhere along the short length of the serpentine line between the test cells $T_5$ and $T_2$. Visual inspection can then focus on the semiconductor area between the first and second test cells of the second column to visually locate and diagnose the known defect.

As the known defect can now be quickly located and visually observed, the processing variation which caused the induced open-circuit defect can be quickly determined to provide quick corrective feedback data which, in turn, leads to higher manufacturing yields since non-ideal conditions can be quickly corrected before there is substantial continued manufacturing.

In the above and further testing operations to be described, one obvious and very attractive alternative to the mapping approach is computer analysis of the testing data to provide visual scanning coordinates from some reference point on the fabricated semiconductor defect monitor. For example, the computer would provide orthogonal scanning coordinates using the first test cell as a starting reference point.

In addition to providing continuity testing and defect locating along the long serpentine line 220, the present invention also provides for monitoring of processing defects along the row lines 202, 204 and 206. As an illustrative example of monitoring for a row line defect, an open circuit defect is assumed has been induced along the length of the row line 204, between the test cells $T_5$ and $T_8$. This defect is illustrated by an "X" in FIG. 5. Furthermore, in this example it is assumed that all other structures of the defect monitor are, themselves, functioning properly without processing-induced defects.

As a first step in testing the row lines for processing-induced defects, a logical one voltage potential is applied to either of the test contact pads 222 or 224 such that, in effect, a logical one voltage potential is supplied along the serpentine line length to be available for accessing by each of the test cells $T_1$ through $T_{12}$. Each unique combination of a row line 202, 204 or 206 and a column line 212, 214, 216 or 218 is, then, used to activate the internal transistor of each of the individual test cells in an attempt to access the voltage potential along the serpentine line 220. As each of the respective test cells $T_1-T_{12}$ is activated, the appropriate column lines 212, 214, 216 or 218 would be used to sense for the voltage potential. In essence, this is the same series of continuity tests which were conducted for the previously described continuity testing of the serpenting line 220.

Figure 5:
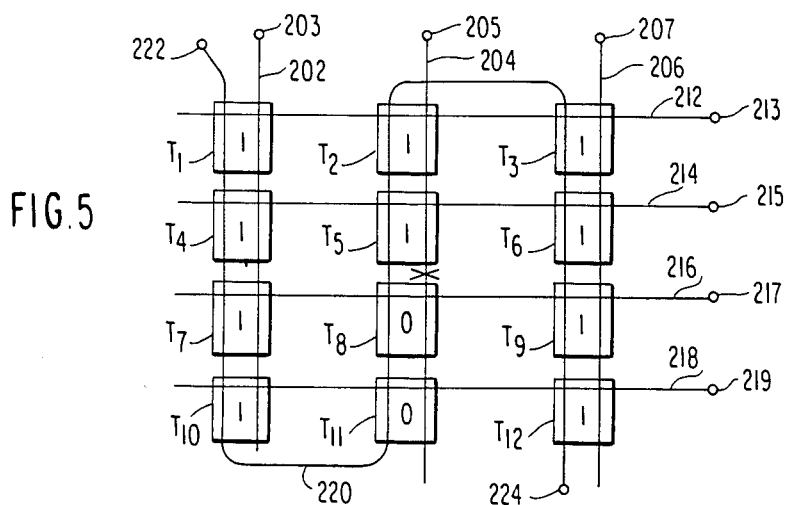
FIG. 5 illustrates the manner in which bit map analysis is used approximately to locate an open-circuit defect induced in a matrix row line of the defect monitor of FIG. 2.

After thorough testing using all of the test cells, the results of each continuity test are posted in the respective test cells of a representation of the matrix array, resulting in the bit map illustrated in FIG. 5. In analyzing the bit map, note that the first row line 202 sequence is comprised of the test cells $T_1$, $T_4$, $T_7$ and $T_{10}$, respectively. A logical one has been posted in each of the test cells $T_1$, $T_4$, $T_7$, $T_{10}$ to indicate that each cell was properly activated to allow access to the potential on the serpentine line; therefore, it is determined that the row line 202 is defect-free. A similar description can be made for the third row line 206.

Turning now to the second row line 204, note that the row line sequence is comprise of the test cells $T_2$, $T_5$, $T_8$ and $T_{11}$, respectively. During testing of this second row, a potential applied along the row line 204 was used in an attempt to activate the internal transistor of each of these individual test cells. Again, if the internal transistor of a respective test cell is properly activated, electrical connection of the respective column line to serpentine line 220 is made. This is the case of the test cells $T_2$ and $T_5$ as indicated by logical one in the bit map of FIG. 5. In contrast, logical zeros are indicated in the test cells $T_8$ and $T_{11}$, indicating a failure in the continuity test using these respective test cells. By analyzing the test data in the light of the known path sequence of the row line 204, it can be determined that an open circuit defect has been induced to disrupt the continuity of the row line 204 between the test cells $T_5$ and $T_8$. Visual inspection can then focus on the relatively small semiconductor area between these tests cells to visually locate the known defect and determine the appropriate corrective action.

Thus, it can be seen that, if continuity testing using each of the individual test cells is conducted and the path sequences along respective row lines are known, the approximate location of row line defects can be determined within a relatively short length of a respective row line. This feature makes the present invention particularly advantageous, in that is provides defect monitoring of a semiconductor structure formed of a different structure, material and processing stage than the previously described serpentine line. In the preferred embodiment, this monitoring operation involves testing the row lines formed of a polysilicon material, whereas the previous monitoring operation tested the serpentine line formed of a diffusion material.

The present invention also facilitates defect monitoring of the column lines. As another illustrative example, an open circuit defect is assumed along the column line 214 between the test cells T5 and T6. Furthermore, in this example it is also assumed that all remaining constructions are operating properly, i.e. without processing-induced defects.

Figure 6:
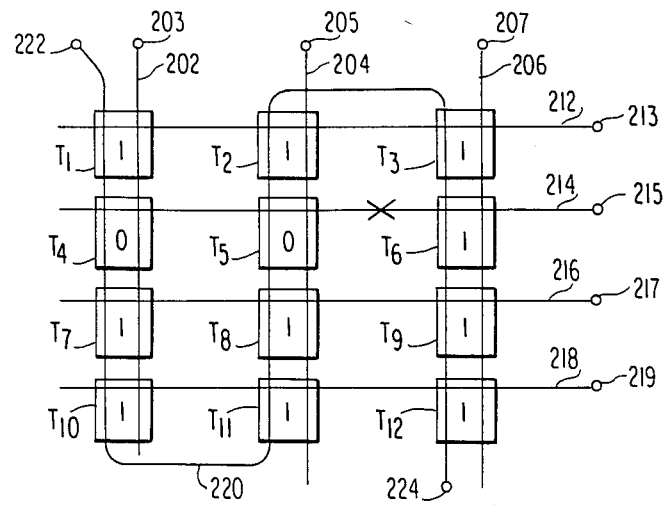
FIG. 6 illustrates the manner in which bit map analysis is used to approximately locate an open-circuit defect induced in a matrix column line.

In column line monitoring, the testing applied is exactly the same as was described immediately above for the row line monitoring. After thorough testing using all of the test cells, the resultant bit map is as shown in FIG. 6. Note that the test cell sequence along the column line 212 is comprised of the test cells $T_3$, $T_2$, and $T_1$. A logical one has been posted in each of these test cells to indicate that access to the potential on the serpentine line was achieved; therefore, it is determined that the column line 212 is defect-free. Similar descriptions can be made for the column lines 216 and 218.

Turning now to column line 214, note that the sequence of test cells along this column line is comprised of the test cells $T_6$, $T_5$, and $T_4$. The column line 214 is used by each of the respective test cells as a conductive path during continuity testing between the serpentine line 220 and the test contact pad 214. Continuity is detected as long as there is no open-circuit defect to disrupt the conductive path between the serpentine line and the test contact path 215. This is the case for test cell $T_6$ as indicated by a logical one is not detected when using test cells $T_4$ and $T_5$, as indicated by logical zeros in the bit map of FIG. 6. By analyzing the test data in the light of the known physical position of the column line 214, it can be determined than an open circuit defect has been induced to interrupt the continuity of the column line 214 between the test cells $T_5$ and $T_6$. Visual inspection can then focus on the relatively small semiconductor area between these test cells to visually locate the known defect, and determine the appropriate corrective action.

Thus, it can be seen that, if continuity testing using each of the respective individual test cells is conducted and the path sequences along respective column lines are known, the approximate location of column line defects can be determined within a relatively short section of a respective column line.

The above feature makes the present invention additionally advantageous, in that it facilitates defect monitoring of a third semiconductor structure formed of a different structure, material and processing stage from the previously described serpentine and row lines. In the preferred embodiment, this monitoring operation tests the column lines formed of a metallic material, whereas the previous monitoring operations tested the serpentine and row lines formed of polysilicon and diffusion materials respectively.

As a summary of the previously described features, it can be seen that the present invention facilitates the construction of a semiconductor-processing defect monitor which provides multiple defect monitoring operations of at least three semiconductor structures at three different planar levels.

In addition to continuity testing for open-circuit defects, the present invention also facilitates monitoring to test for short-circuit defects in the insulation layers between overlapping planar levels. As mentioned previously, the row lines, column lines and serpentine lines of the present invention are at different planar levels of the semiconductor structure. As all three of these lines are made of a conductive material, an insulation layer must be provided between these different conductive layers. Occasionally, processing variations occur such that defects are induced to disturb the insulation quality of these layers. Examples of resultant defects include localized thinning of the insulation layer, porosity or pin holes through the insulation layer, etc. Typically, these defects have the potential to produce a short-circuit at any point where these conductive layers are overlapping.

Turning now to a more detailed description, short-circuit defect monitoring is based on the fact that, in a properly fabricated defect monitor, each of the individual row lines an individual column lines and the serpentine line should all be electrically isolated from one another, assuming that none of the internal transistors of the test cells has been activated. In short-circuit testing, a voltage potential is applied along one of the conductive lines through the appropriate test contact pad. If a short-circuit defect has been induced between any of the overlapping conductive lines, the voltage potential will also appear along a second conductive line. Thus, the remaining conductive lines are tested for the appearance of the voltage potential. As one example, a voltage potential can be applied to the serpentine line 220 using either of the test contact pads 222 or 224, and then a short-circuit test can be applied to each of the individual row line and column lines using the test contact pads 203, 205, 207, 213, 215, 217, and 219.

In order to perform exhaustive short-circuit testing of the defect monitor of the present invention, a voltage potential should be applied to the serpentine line 220 while testing each of the individual row lines and column lines, and then a voltage potential should be applied to each of the individual row lines while testing each of the respective column lines. This insures that short-circuit testing is conducted for each potential overlap site.

If a short-circuit is found to be present between two conductive lines, the defect monitor design layout can then be used to locate the appropriate semiconductor area where the overlap short-circuit defect has occurred. Visual inspection can then focus on this relatively small overlap area to visually observe the known defect to determine the appropriate corrective action Thus, it can be seen that the invention is additionally attractive in that it provides for defect monitoring of insulation layers, which is a different defect monitoring operation than was described for the above row lines, column lines and serpentine lines.

Figure 8:
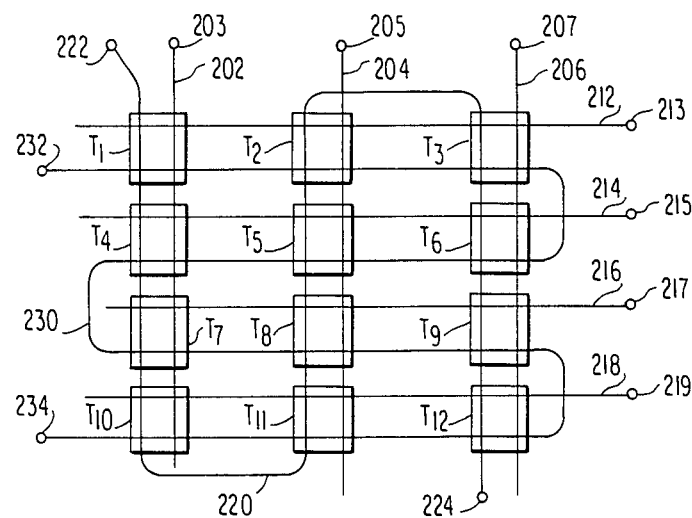
FIG. 8 is a simplified circuit diagram of a preferred embodiment of a semiconductor-processing defect monitor of the present invention.

Turning now to FIG. 8, there is shown a preferred embodiment of the present invention. In FIG. 8, constructions which have not changed from those in FIG. 2 have been given the same reference numerals and will not be further described.

In FIG. 8 there is shown the addition of a second serpentine line 230. As was the case with the first serpentine line 220, the second serpentine line 230 is configured to cross or pass in close proximity to each of the individual test cells $T_1$ through $T_{12}$. The second serpentine line 230 is terminated in test contact pads 232 and 234, and is formed of a conductive material at a different planar level than that used for the first serpentine line. In a preferred embodiment, this second serpentine line 230 would be formed at a metal level, whereas the first serpentine line 220 is formed at a diffusion level.

Figure 9:
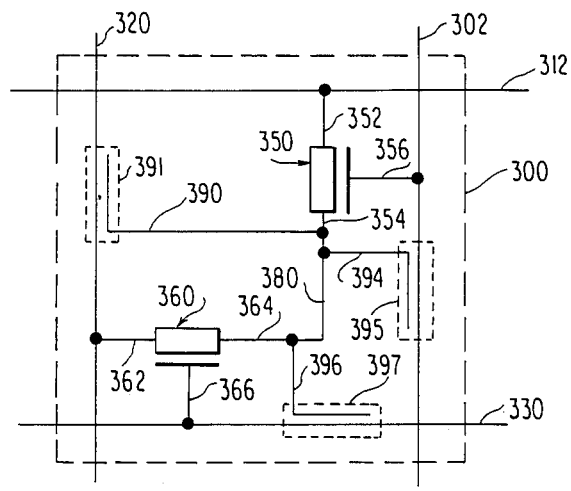
FIG. 9 is a simplified schematic diagram of a preferred embodiment of a test cell of the present invention.

Turning now to FIG. 9, there is shown a preferred embodiment of a test cell 300 to be used with the defect monitor layout illustrated in FIG. 8. In FIG. 9, constructions which have not changed from those in FIG. 3 are given the same reference numerals, and will not be further discussed.

In FIG. 9, there is shown the addition of the second serpentine line 330. It should be noted that the test cell 300 of FIG. 9 can represent any of the test cells $T_1$ through $T_{12}$ in FIG. 8. As an example, if the test cell 300 were to represent the internal circuitry of the test cell $T_1$, the row line 302, column line 312, first serpentine line 320 and the second serpentine line 330 would exactly correspond to the row line 202, column line 212, first serpentine line 220 and the second serpentine line 230, respectively, in FIG. 8.

In FIG. 9, there is also shown the addition of a second transistor 360. The second transistor has a first current-carrying electrode 362, a second current-carrying electrode 364 and a control electrode 366. The first current carrying electrode 362 is shown connected to the first serpentine line 320, while the control electrode 366 is shown connected to the second serpentine line 330. The second current carrying electrode 364 of the transistor 360 is shown connected to the node 380 which in turn is connected to the second current carrying electrode 354 of the first transistor 350.

Note that the first transistor 350, the node 380 and the second transistor 360 form a series electrical path between the first serpentine line 320 and the column line 312.

If a respective test cell is not being used to conduct a defect monitoring test, the first serpentine line 320, the node 380 and the column line 312 will typically be electrically isolated from one another due to the non-conducting first and second transistor 350 and 360.

The control of electrical conduction along this series path is achieved by using either of the control electrodes 356 or 366 of the first and second transistors 350 and 360, respectively. The control electrode of the first transistor 350 can be activated using the row line 302, as was described previously with reference to the illustration of FIG. 3. The second transistor 360 can be activated using the second serpentine line 330.

An important feature to note is that the serpentine line 230 in FIG. 8 is connected to the control electrode of the second internal transistor of each of the individual test cells $T_1$ through $T_{12}$. Thus, if an activating potential is applied along the serpentine line 230, the second transistor 360 of all the individual test cells $T_1$ through $T_{12}$ will be turned on.

In addition to the inclusion of a second serpentine line 330 and the second transistor 360, there is also shown the addition of short-circuit monitoring structures 390, 393 and 396 which are formed of conductive material connected to, and projecting from, the node 380. In order to monitor for short-circuit defects between closely spaced conductive lines, each of the short-circuit monitoring structures is designed such that the portion of its length is parallel and in close proximity to one of the row lines 302, first serpentine line 320 or the second serpentine line 330. Note that a fourth short-circuit monitoring structure can also be formed to project from the node 380 and have a length which is parallel, and in close proximity to the column line 312. These lengths, which are parallel and in close proximity, are represented by the dash areas 391, 395 and 397 for the short-circuit monitoring structures 390, 394 and 396, respectively.

It should also be noted that each respective short-circuit monitoring structures 390, 394 or 396 is formed of the same conductive material, and is on the same planar level, as the conductive line with which it is parallel and in close proximity to. In effect, the short-circuit monitoring structures 390, 394 and 396 represent short-circuit monitoring structures which are similar to that described with respect to FIG. 1B.

The preferred short-circuit monitoring structures will now be described in greater detail. The monitoring structure 390, which is partially parallel and in close proximity to the first diffusion serpentine line 320, would be formed of a diffusion material at a diffusion level. The short-circuit monitoring structure 394, which is partially parallel to and in close proximity to the polysilicon row line 302, would be formed of polysilicon material at a polysilicon level. Finally, the short-circuit monitoring structure 396, which is parallel and in close proximity to the metallic second serpentine line 330, would be formed of a metallic material at a metallic level. Each of the above short-circuit monitoring circuits results in a region where two lines are constructed parallel and in close proximity with a "minimum ground rule spacing".

The construction having been described, the operation of the preferred defect monitor will now be explained.

With regard to defect monitoring, the preferred defect monitor of FIGS. 8 and 9 can perform all of the defect monitoring operations discussed previously with regard to the defect monitor of FIGS. 2 and 3. This can most readily be seen by first observing that the second serpentine line 230 is connected to the control electrode of the second internal transistor of each of the test cells $T_1$ and $T_{12}$. If an activating potential is applied along the length of the second serpentine line 230, the second internal transistors of all the individual test cells $T_1$ through $T_{12}$ will be turned on, resulting in an effective structure which (other than the short-circuit monitoring structures 390, 394 and 396) is that of the defect monitor described with reference to FIG. 3.

The preferred defect monitor of FIGS. 8 and 9 also facilitates defect testing for short-circuit defects between closely placed parallel lines. This short-circuit defect monitoring is based on the fact that, as long as one of the first internal transistors 350 or the second internal transistors 360 is not conducting, the individual row line 302, column line 312, the first serpentine line 320 and the second serpentine line 330 should all be electrically isolated from one another. If a processing variation is such as to induce a short-circuit between one of the short-circuit monitoring structures and one of the respective lines, this electrical isolation will not be maintained.

In order to conduct a test for short-circuit defects, a sensing circuit is connected to sense for currents along the column line of the defect monitor cell to be tested. This sensing circuit, in a preferred embodiment, is included as part of the support circuitry fabricated along with the defect monitor, as shown in FIG. 7B. The actual circuitry of a sensing circuit is not shown, since these circuits, per se, are not the subject matter of the present invention, and numerous possible circuit configurations are well known in the art.

Turning now to FIG. 9, a sensing circuit for sensing currents along the column line 312 is assumed. In order to conduct a test of the short-circuit monitoring structure 394, the potentials along the first serpentine line 320 and second serpentine line 330 are brought low. The potential along the row line 302 is brought high, thus activating the first transistor 350 to connected the node 380 to the column line 312. In a properly fabricated defect monitor cell, the sensing circuit will not sense a current, because the node 380 is isolated. If, however, a current is sensed, a short-circuit defect is indicated in the "minimum ground rule" spacing 395.

In order to conduct a test of the short-circuit monitoring structure 396, the potential along the first serpentine line 320 is brought low, and the potential along the row line 302 is brought high, again to connect the node 380 to the column line 312 through the transistor 350. A high potential is applied along the second serpentine line 330. In a properly fabricated defect monitor cell, the sensing circuit will not sense a current because the node 380 is isolated. If, however, a current is sensed, a short-circuit defect is indicated in the "minimum ground rule" spacing 397.

Finally, in order to conduct a test of the short-circuit monitoring structure 390, the potential along the row line 302 again remains high, the second serpentine 330 is brought low, and the first serpentine 320 is brought high. Again, the sensing circuit will not sense any current if the defect monitor cell has been properly fabricated. If, however, current is sensed, a short-circuit defect is indicated in the "minimum ground rule" spacing 391.

If a short-circuit defect has been indicated in any of the above tests, magnification of the appropriate area of the defect monitor cell can be made to readily and easily conduct visual observation and determination of the appropriate corrective action. In order to perform a comprehensive test, each defect monitor cell of the fabricated array should be tested.

As the short-circuit monitor 394 and the row line 302 are of a polysilicon construction, the short-circuit monitoring structure 396 and the second serpentine line 330 are of a metallic construction, and the short-circuit monitoring structure 390 and the first serpentine line 320 are of a diffusion construction, note that this preferred defect monitor allows short-circuit defect monitoring of closely-spaced parallel lines of at least three different planar levels, materials and processing stages.

With the majority of the prior art approaches, each defect monitor was sensitive only to the first occurrence of a processing defect; (i.e., a "fail" was an indication that "at least one" defect had occurred, but was no indication as to whether "more than one" defect had occurred). Such is not the case with the present invention.

The defect monitor of the present invention has effectively been divided into segments through the use of a number of row, column and test cells connected along the serpentine line. As a result, each defect monitor of the present invention is able to sustain and provide data as to a plurality of defects. As one example, the defect monitor shown in FIGS. 8 and 9 would easily sustain a large number of open circuit and short circuit defects and still provide data as to the locations of these defects.

With regard to this multiple defect monitoring capability, it should be stated that statistical calculations can be used to calculate the lengths, widths and spacing of the various structures such that there is a high probability that only one defect will be induced per segment; (i.e., per row line, column line, serpentine lines and the cells.)

Figure 10:
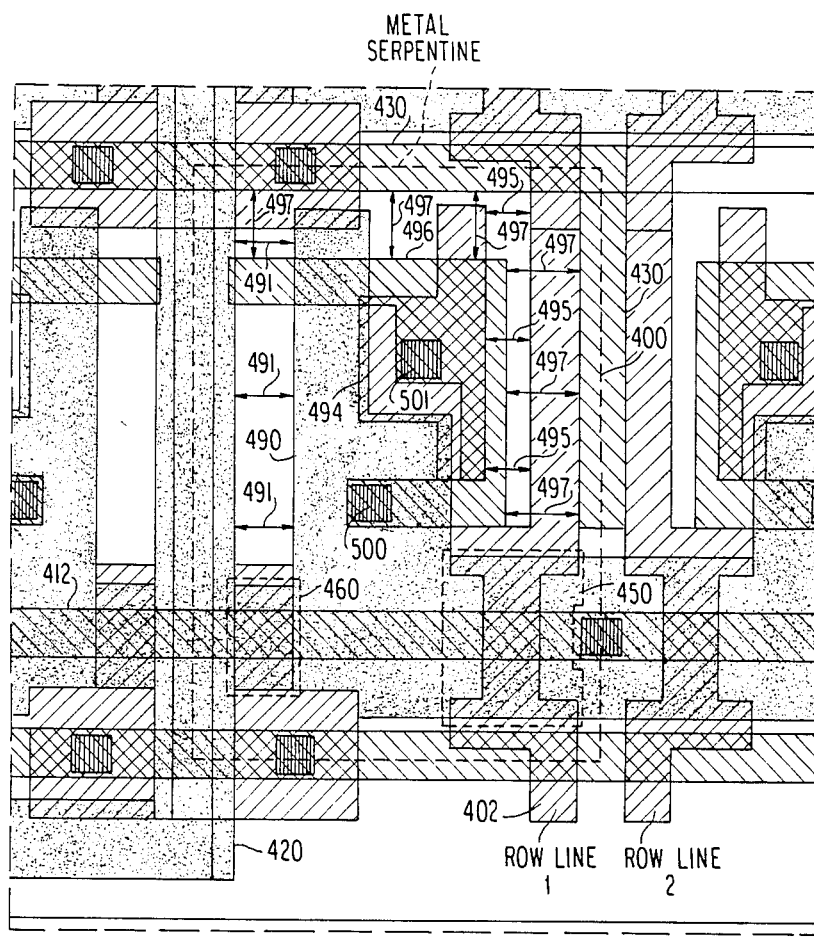
FIG. 10 is a topographical diagram of the semiconductor layout pattern to fabricate a preferred embodiment test cell of the present invention.

Turning now to FIG. 10, there shown a preferred semiconductor design layout 400 for one preferred defect monitor test cell. This layout can be repeated in all directions to provide a defect monitor array with the desired number of test cells.

In FIG. 10, there is shown a first serpentine line 420 formed of a diffusion material, a second serpentine line 430 formed of a metallic material, a row line 402 formed of a polysilicon material and, finally, a column line 412 formed a metallic material. Note that each of these lines crosses or passes in close proximity to the layout area 400 of the test cell.

At the bottom of the layout area 400, there are formed two transistors 450 and 460 at locations where polysilicon layout structures overlap diffusion layout structures. The transitor 450 corresponds to the first internal transistor 350 of FIG. 9 whereas the transistor 460 corresponds to the second internal transistor 360 of FIG. 9. The semiconductor layout structures between the transistors 450 and 460 correspond to the node 380 of the FIG. 9. The semiconductor layout structures lying above this region and to the center of the layout region 400 correspond to the short-circuit defect monitoring structures.

In greater detail, there is shown a short-circuit defect monitoring structure 490 which is parallel and in close proximity to the first serpentine line 420. The first serpentine line 420 and the short-circuit monitoring structure 490 are both formed of a diffusion material and are separated by a minimum ground rule spacing 491. There is also shown a second short-circuit defect monitoring structure 496 parallel and in close proximity to the second serpentine line 430. The short-circuit defect monitor structure 496 and the second serpentine line 430 are both formed of a metallic material and are separated by a minimum ground rule spacing 497. Finally, there is shown a third short-circuit monitoring structure 494 which is parallel and in close proximity to the row line 402. The short-circuit defect monitoring structure 492 and the row line 402 are formed of a polysilicon material and are separated by the minimum ground rules spacing 495.

The areas 500 and 501 represent contact hole structures which extend into the paper. As mentioned previously, the diffusion, polysilicon and metal layers are at different planar levels of the semiconductor structure. The purpose of the contact hole structures 500 and 501 is to provide electrical connection between the short-circuit defect monitoring structures 490, 494 and 496. In addition to the contact hole structures 500 and 501 which provide electrical connections, it should be understood that there is typically provided an insulation layer between the diffusion, polysilicon and metal planar levels.

In conclusion, the present invention provides a unique semiconductor-processing defect monitor which allows the location of known defects to be approximately determined, and which facilitates quick visual observation and prompt determination of the appropriate corrective action. One embodiment of the invention facilitates a number of defect monitoring operations. First, continuity testing can be used to test for open circuit induced defects on a first planar level using a long serpentine line. Second, continuity testing can be used to test for open-circuit induced effects on second and third planar levels by using the long serpentine lines in association with the row and column lines. Third, conductivity testing can be used to test for short-circuit defects induced in the isolation layers between different conductive levels. The second preferred defect monitor described (FIGS. 8 and 9) facilitates additional defect monitoring operations. In particular, conductivity testing can be used to test for short-circuit defects induced between conductive lines which are placed in close parallel proximity at the same planar level. This testing operation was shown to be facilitated at each of diffusion, polysilicon and metal planar levels. Once a processing-induced defect has been indicated by any of the above operations, the array layout associated with the defect monitor can be used to determine the approximate location of the known defect. This facilitates prompt visual observation of the known defect and thus prompt determination of the appropriate corrective action. This prompt determination increases manufacturing yield, as corrective action can be quickly applied to correct non-ideal processing conditions before substantial continued manufacturing has occurred.

The semiconductor-processing defect monitor of the invention and many of its attendant advantages will be understood from the foregoing description. It should be realized, however, that the invention is not limited to the embodiments specifically disclosed, since various changes can be made in the form, construction and arrangements of the parts thereof without departing from the spirit and scope of the invention and sacrificing all its material advantages, the form herein described being merely a preferred or exemplary embodiment of the invention thereof.

Having thus set forth the nature of the invention, What is claimed is:

1. A semi-conductof-processing defect monitor comprising:
   a conductive line;
   a plurality of column lines connectable to column decoder circuitry;
   a plurality of row lines connectable to row decoder circuitry; and
   a plurality of test cells, each respective test cell being provided at a different location along the length of said conductive line, each said respective test cell comprising transistor means connected to said conductive line and to a different combination of one of said row lines and one of said column lines, such that said row lines, said column lines and said transistor means of said test cells are used to facilitate selective electrical access to different lengths of said conductive line.

2. A semiconductor-processing defect monitor comprising:
   a conductive line;
   a plurality of column lines connectable to column decoder circuitry;
   a plurality of row lines connectable to row decoder circuitry; and
   a matrix of test cells arranged in columns and rows, each individual test cell comprising transistor means connected to a different combination of one of said column line and one of said row lines, and to a different location along the length of the conductive line, such that said column line, said row line, and said transistor means are used to facilitate selective electrical access to a different length of said conductive line.

3. A semiconductor-processing defect monitor comprising:
   a plurality of cells arranged in columns and rows, each of said cells including first and second serially connected transistors, each transistor having first and second current-carrying electrodes and a control electrode;
   a first plurality of conductive lines, a respective one of said lines being connected to the control electrode of each of said first transistors in a column;
   a second plurality of conductive lines, a respective one of said second lines being connected to one of said current-carrying electrodes of each of said first transistors in a row;

a third conductive line connected to one of said current-carrying electrodes of at least a portion of said second transistors; and a fourth conductive line connected to the control electrode of at least a portion of said second transistors.

4. A semiconductor-processing defect monitor as set forth in claim 3 wherein said transistors are field effect transistors.

5. A semiconductor-processing defect monitor as set forth in claim 3, further comprising a column decoder connected to said first plurality of conductive lines and a row decoder connected to said second plurality of conductive lines.

6. A semiconductor-processing defect monitor as set forth in claim 3, wherein each of said cells further comprise a fifth conductive line connected at one end to the common point between said first and second transistors and arranged parallel to one of said first, second, third and fourth lines.

7. A semiconductor-processing defect monitor as set forth in claim 3, wherein each of said cells further includes a fifth plurality of conductive lines, each respective one of said fifth plurality of conductive lines being connected at one end to the common point between said first and second transistors and arranged parallel to one of said first, second, third and fourth lines.

8. A semiconductor-processing defect monitor as set forth in claim 7, wherein each of said respective conductive lines of said fifth plurality is made of the same material as the one of said first, second, third and fourth conductive lines with which it is arranged in parallel.

9. A semiconductor-processing defect monitor as set forth in claim 8, wherein said first plurality of conductive lines are polysilicon lines, said third conductive line is a semiconductor diffusion line and said fourth conductive line is a metallic line.

10. A semiconductor-processing defect monitor comprising:
a matrix of test cells arranged in columns and rows, each of said test cells comprising a test node;
a plurality of column lines connectable to column decoder circuitry;
a plurality of row lines connectable to row decoder circuitry;
first transistor means in each of said test cells, said first transistor means being connected to one of said column lines, to one of said row lines, and to said test node of the respective test cell, such that said row line, said column line and said first transistor means are used to selectively access the test node of each of said test cells;
a first and a second conductive line provided in close proximity to the individual test cells of at least a portion of said matrix; and
second transistor means in the individual test cells of at least a portion of said matrix, said second transistor means being connected to said first and second conductive lines and to said test node of the respective test cell, such that said first and second conductive lines and said second transistor means are used to provide access to the test nodes of the test cells of at least a portion of said matrix.

11. A semiconductor-processing defect monitor as claimed in claim 10, further comprising a third conductive line connected to the test node of each of said test cells, a portion of the length of said third conductive line being constructed parallel to one of said column, row, first and second conductive lines.

12. A semiconductor-processing defect monitor as claimed in claim 10, further comprising third, fourth, and fifth conductive lines connected to the test node of each of said test cells, a portion of the length of said third, fourth and fifth conductive lines being parallel to said row, first and second conductive lines, respectively.

13. A semiconductor-processing defect monitor as claimed in claim 11, wherein said third conductive line is additionally constructed on the same planar level and of the same material as the one of said column, row, first and second conductive lines to which it is parallel.

14. A semiconductor-processing defect monitor as claimed in claim 12, wherein said third, fourth, and fifth conductive lines are additionally constructed on the same planar level and of the same material as said row, first and second conductive lines, respectively.

15. A semiconductor-processing defect monitor as claimed in claim 10, wherein said plurality of column lines are connected to said column decoder circuitry, and said plurality of row lines are connected to said row decoder circuitry.

16. A semiconductor-processing defect monitor as claimed in claim 10, additionally comprising contact test pads connected to the ends of said column lines, row lines, and first and second conductive lines to facilitate electrical connection to said semiconductor-processing defect monitor.

* * * * *